US012756395B2

(12) United States Patent
Jeong et al.

(10) Patent No.: US 12,756,395 B2
(45) Date of Patent: Oct. 6, 2026

(54) STORAGE DEVICE INCLUDING PAD FOR DETERMINING LINK STARTUP MODE AND METHOD OF CONTROLLING LEVEL OF PAD FOR DETERMINING LINK STARTUP MODE THEREOF

(71) Applicant: Samsung Electronics Co., Ltd., Suwon-si (KR)

(72) Inventors: Yongwoo Jeong, Suwon-si (KR); Jeongsu Kim, Suwon-si (KR); Dongwoo Nam, Suwon-si (KR); Kwanwoo Noh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 114 days.

(21) Appl. No.: 18/795,795

(22) Filed: Aug. 6, 2024

(65) Prior Publication Data

US 2025/0266839 A1 Aug. 21, 2025

(30) Foreign Application Priority Data

Feb. 20, 2024 (KR) ........................ 10-2024-0024159

(51) Int. Cl.
*H03K 19/1776* (2020.01)
*H03K 19/017* (2006.01)

(52) U.S. Cl.
CPC ... *H03K 19/1776* (2013.01); *H03K 19/01742* (2013.01)

(58) Field of Classification Search
None
See application file for complete search history.

(56) References Cited

U.S. PATENT DOCUMENTS 6,055,191 A 4/2000 Sher et al.
6,118,303 A 9/2000 Schmitt et al.
(Continued)

FOREIGN PATENT DOCUMENTS

JP 2004-72231 A 3/2004
JP 2009-44542 A 2/2009
(Continued)

OTHER PUBLICATIONS

Extended European Search Report in European Appln. No. 24220151.5, mailed on May 16, 2025, 9 pages.

*Primary Examiner* — Jany Richardson
(74) *Attorney, Agent, or Firm* — Fish & Richardson P.C.

(57) ABSTRACT

A storage device including a non-volatile memory device; a memory controller controlling data input to the non-volatile memory device and data output from the non-volatile memory device; and a device interconnect layer transmitting signals received from a host to the memory controller. The device interconnect layer includes a first pad that inputs first data to be stored in the non-volatile memory device and that outputs second data stored in the non-volatile memory device; a second pad that receives a link startup mode signal from the host that indicates a link startup mode of the memory controller; a pull-down resistor between the second pad and a ground terminal; and a pad level control circuit that controls a voltage level of the second pad by controlling connection or disconnection of the pull-down resistor to the ground terminal based on the link startup mode signal.

20 Claims, 12 Drawing Sheets

(56) References Cited

U.S. PATENT DOCUMENTS

| | | | | |
|---|---|---|---|---|
| 8,134,874 | B2 | 3/2012 | Shiu et al. | |
| 8,462,534 | B2 | 6/2013 | Kim et al. | |
| 8,564,335 | B1 | 10/2013 | Weiser | |
| 9,488,996 | B2 | 11/2016 | Bossu et al. | |
| 9,647,664 | B2 | 5/2017 | Lee | |
| 2015/0061734 | A1 | 3/2015 | Ogawa et al. | |
| 2021/0104283 | A1* | 4/2021 | Chyan | G06F 1/26 |
| 2021/0294504 | A1 | 9/2021 | Shirakura et al. | |
| 2022/0164117 | A1 | 5/2022 | Guo et al. | |
| 2022/0236917 | A1* | 7/2022 | Kang | G11C 5/025 |
| 2022/0406387 | A1 | 12/2022 | Vigdorchik et al. | |
| 2024/0096261 | A1* | 3/2024 | Cheng | H04N 7/10 |

FOREIGN PATENT DOCUMENTS

| | | | |
|---|---|---|---|
| KR | 10-0450955 | B1 | 10/2004 |
| KR | 2006-0020339 | A | 3/2006 |
| KR | 2008-0066296 | A | 7/2008 |
| KR | 10-1296001 | B1 | 8/2013 |
| KR | 10-1770712 | B1 | 8/2017 |

* cited by examiner

FIG. 6

| Level Control Mode | PDFC | LMS | Vdet | PDSW | Link Startup Mode |
|---|---|---|---|---|---|
| Automatic mode | L | L | L | H | LSM1 |
| | L | H | H | L | LSM2 |
| Manual mode | H | L | L | H | |
| | H | H | H | H | |

STORAGE DEVICE INCLUDING PAD FOR DETERMINING LINK STARTUP MODE AND METHOD OF CONTROLLING LEVEL OF PAD FOR DETERMINING LINK STARTUP MODE THEREOF

CROSS-REFERENCE TO RELATED APPLICATIONS

This application claims priority under 35 U.S.C. § 119 to Korean Patent Application No. 10-2024-0024159 filed on Feb. 20, 2024, in the Korean Intellectual Property Office, the disclosure of which is incorporated by reference herein in its entirety.

BACKGROUND

Example embodiments of the present disclosure described herein relate to storage devices including semiconductor memory, and more particularly, relate to storage devices including a pad for determining a link startup mode and a method of controlling a level of the pad for determining the link startup mode thereof.

Semiconductor memory may be mainly classified as volatile memory or non-volatile memory. Read and write speeds of volatile memory (for example, DRAM or SRAM) are fast, but the data stored in volatile memory is lost when a power is turned off. In contrast, non-volatile memory may retain data even when power is turned off. Therefore, non-volatile memory may be used to store content that must be preserved regardless of whether power is supplied or not.

A representative example of non-volatile memory is flash memory. Flash memory is widely used as a storage medium for audio and video data in information devices such as computers and smartphones. Recently, high-capacity, high-speed input/output and low-power technologies for flash memory are being actively researched for installation in mobile devices such as smartphones.

A storage device including non-volatile memory may be connected through various pads for communication with a host. The storage device may initiate communication with the host through various link startup modes. However, when receiving a signal which determines one of the link startup modes, current leakage may occur through a pad receiving the signal in the storage device.

SUMMARY

Some example embodiments of the present disclosure provide a storage device automatically connecting or disconnecting a pull-down resistor connected to a link startup mode decision pad based on a link startup mode signal and a method of controlling a level of the link startup mode decision pad.

Some example embodiments provide a storage device which that includes a non-volatile memory device; a memory controller that controls data input of first data to the non-volatile memory device and output of second data from the non-volatile memory device; and a device interconnect layer that transmits signals received from a host to the memory controller. The device interconnect layer includes a first pad that inputs the first data to be stored in the non-volatile memory device and outputs the second data from the non-volatile memory device; a second pad that receives a link startup mode signal from the host, the link startup mode signal indicating a link startup mode of the memory controller; a pull-down resistor between the second pad and a ground terminal; and a pad level control circuit that controls a voltage level of the second pad by controlling connection or disconnection of the pull-down resistor to the ground terminal based on the link startup mode signal.

Some example embodiments further provide a universal flash storage (UFS) device that includes a flash memory; a UFS device controller that controls input of first data to the flash memory and output of second data from the flash memory; and a UFS device interface that transmits signals received from a UFS host to the UFS device controller. The UFS device interface includes a first pad that inputs the first data to be stored in the flash memory and outputs the second data from the flash memory; a second pad that receives a link startup mode signal from the UFS host, the link startup mode signal indicating a link startup mode of the UFS device controller; a pull-down resistor that determines a voltage level of the second pad; and a pad level control circuit that controls the voltage level of the second pad by controlling connection or disconnection of the pull-down resistor to a ground terminal based on the link startup mode signal.

Some example embodiments still further provide a level control method of a link startup mode decision pad in a storage device, the method includes setting a level control mode of the link startup mode decision pad; and connecting or disconnecting a pull-down resistor to a ground terminal based on a voltage level of a link startup mode signal received through the link startup mode decision pad when the level control mode is set to an automatic mode, the pull-down resistor being connected to the link startup mode decision pad.

BRIEF DESCRIPTION OF THE FIGURES

The above and other objects and features of the present disclosure will become apparent in view of the following description of some example detail embodiments with reference to the accompanying drawings.

FIG. 6 is a table illustrating levels of signals related to a pad level control circuit of FIG. 5 for each mode.

DETAILED DESCRIPTION

Below, some example embodiments of the present disclosure will be described in detail and clearly to such an extent that one of ordinary skill in the art may easily implement the inventive concepts.

Figure 1:
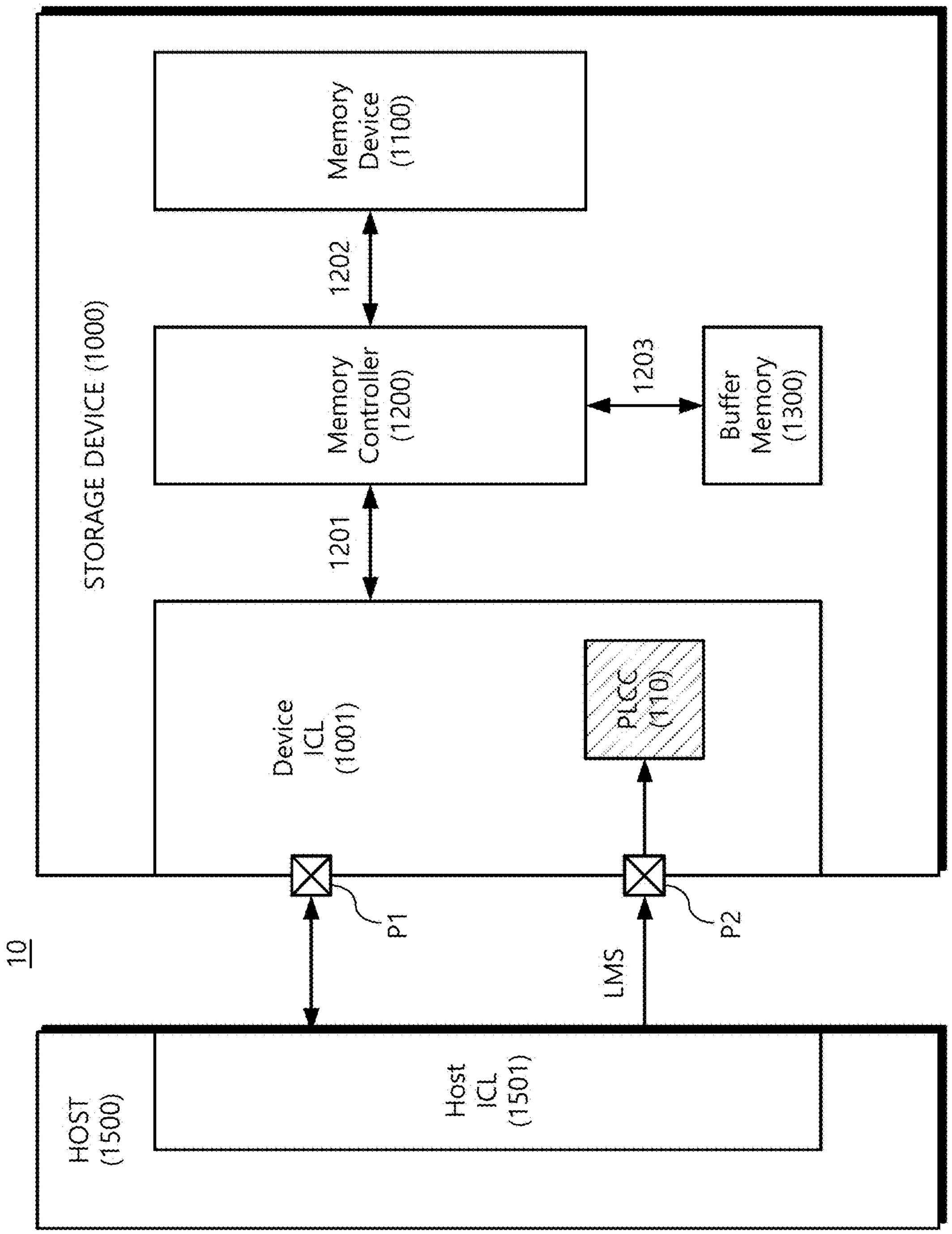
FIG. 1 is a block diagram illustrating a user device according to some example embodiments.

FIG. 1 is a block diagram illustrating a user device according to some example embodiments. Referring to FIG. 1, a user device 10 may include a storage device 1000 and a host 1500. The storage device 1000 and the host 1500 may be connected through a host interface 1201. The host interface 1201 may be a standard interface such as ATA, SATA, PATA, USB, SCSI, ESDI, IEEE 1394, IDE, and/or card interface, etc.

According to some example embodiments, a device interconnect layer 1001 may include at least one first pad P1. For example, the device interconnect layer 1001 may exchange various signals (for example, data, commands, addresses, etc.) with a host interconnect layer 1501 through the first pad P1.

According to some example embodiments, the device interconnect layer 1001 may include a second pad P2. For example, the device interconnect layer 1001 may receive a link startup mode signal LMS through the second pad P2. The device interconnect layer 1001 may determine a link startup mode of the storage device 1000 based on the link startup mode signal LMS. As an example, the storage device 1000 may operate in a first link startup mode (for example, a low-speed link startup mode) or a second link startup mode (for example, a high-speed link startup mode). For example, the link startup mode signal LMS may indicate or set a link startup mode of the storage device 1000.

According to some example embodiments, the device interconnect layer 1001 may include a pad level control circuit 110. For example, the pad level control circuit 110 may be connected to the second pad P2. The device interconnect layer 1001 may receive the link startup mode signal LMS from the host interconnect layer 1501 through the second pad P2. The pad level control circuit 110 may control a voltage level of the second pad P2 based on the link startup mode signal LMS. For example, the second pad P2 may be basically set to a first level mode (for example, a pull-down mode). The pad level control circuit 110 may maintain the second pad P2 in the first level mode or change the second pad P2 to a second level mode (for example, a pull-up mode) based on the link startup mode signal LMS.

According to some example embodiments, the storage device 1000 may be a storage device based on non-volatile memory. For example, the storage device 1000 may include a memory device 1100, a memory controller 1200, and a buffer memory 1300. The memory device 1100 may be non-volatile memory such as flash memory or phase change memory (PRAM). When the memory device 1100 is flash memory, the storage device 1000 may be a flash storage device based on the flash memory. For example, the storage device 1000 may be an SSD, UFS, and/or memory card, etc. The buffer memory 1300 may include volatile memory (for example, DRAM).

According to some example embodiments, the memory device 1100 may be connected to the memory controller 1200 through a memory interface 1202. The memory device 1100 may include a memory cell array 1110 (e.g., see FIG. 2) and a peripheral circuit (e.g., peripheral circuitry). The peripheral circuit may include all analog or digital circuits required to store or read data in the memory cell array 1110.

According to some example embodiments, the peripheral circuit may receive external power from the memory controller 1200 and generate various levels of internal power. The peripheral circuit may receive commands, addresses, and data from the memory controller 1200, and store the data in the memory cell array 1110 according to the control signals. The peripheral circuit may read data stored in the memory cell array 1110 and provide the data to the memory controller 1200.

According to some example embodiments, the memory cell array 1110 may include a plurality of memory blocks. Each memory block may have a vertical three-dimensional structure. Each memory block may include a plurality of memory cells. Multi-bit data may be stored in each memory cell. For example, the memory device 1100 may be TLC flash memory capable of storing 3 bits of data in one memory cell.

According to some example embodiments, the memory cell array 1110 may be located next to or above the peripheral circuit due to the design arrangement structure. The structure in which the memory cell array 1110 is located above the peripheral circuit is called a COP (cell on peripheral) structure. The memory cell array 1110 may be manufactured as a separate chip from the peripheral circuit. The upper chip including the memory cell array 1110 and the lower chip including the peripheral circuit may be connected to each other using a bonding method. This structure is called C2C (chip to chip) structure.

According to some example embodiments, the memory controller 1200 may be connected to the host 1500 through a host interface 1201. For the host interface 1201, standard interfaces such as ATA, SATA, PATA, USB, SCSI, ESDI, IEEE 1394, IDE and card interface may be used. The host interface 1201 may communicate with the host 1500 through the device interconnect layer 1001.

According to some example embodiments, the memory controller 1200 may be connected between the memory device 1100 and the host 1500. The memory controller 1200 may be connected between the buffer memory 1300 and the host 1500. The memory controller 1200 may control read or write operations of the memory device 1100 and/or the buffer memory 1300 in response to a request from the host 1500. The memory controller 1200 may receive host data from the host 1500 and provide it to the memory device 1100 and/or the buffer memory 1300.

According to some example embodiments, the memory controller 1200 may include a control unit and a work memory (not shown). The control unit may control overall operations of the memory controller 1200. For example, the control unit may control a flash translation layer (FTL) to perform an address mapping operation. The control unit may be a commercially available or custom microprocessor.

According to some example embodiments, the work memory may be cache memory (for example, a SRAM). The work memory may serve as a buffer memory that temporarily stores data. The work memory may be driving memory of the memory controller 1200. The work memory may drive the FTL.

According to some example embodiments, the FTL may be firmware or a program for efficiently managing the memory device 1100. The memory device 1100 may not support an overwrite function different from a hard disk drive. Therefore, the memory device 1100 may perform the following process while updating data written to the page. First, the memory device 1100 may copy all valid data in the first memory block to which the written page belongs to an empty second memory block. Second, the memory device 1100 may erase the first memory block and make it an empty memory block. The memory device 1100 may perform a large number of page copy operations (for example, a page read operation and/or a page write operation) and erase operations while going through this process.

According to some example embodiments, the FTL may be used between the host 1500 and the memory device 1100 to reduce the number of page copy and erase operations. The FTL may perform an address mapping function, a garbage collection function, and a wear-leveling function, etc. When an overwrite request is received from the host 1500, the address mapping function may write the corresponding data to another empty page instead of overwriting the original page, thereby reducing additional page copy and block erase operations. For this purpose, an address mapping table having a specified size must be maintained in the work memory and the buffer memory 1300. Through this, the FTL may manage an operation of mapping a logical address received from the host 1500 to a physical address or a virtual address in the memory device 1100.

According to some example embodiments, the buffer memory 1300 may be connected to the memory controller 1200 through a buffer interface 1203. For example, the buffer memory 1300 may be used to temporarily store data to be stored in or read from the memory device 1100. A cache area capable of storing cache data may be allocated to the buffer memory 1300.

According to some example embodiments, the buffer memory 1300 may include volatile memory (for example, DRAM). For example, the buffer memory 1300 may be implemented with DRAM and SRAM, etc. The buffer memory 1300 may be included in the memory device 1100 or the memory controller 1200.

According to some example embodiments, the host 1500 may include a processor and a host memory (not shown). The processor and the host memory may be connected via an address/data bus. The host 1500 may be a personal digital assistance (PDA), a computer, a digital audio player, a digital camera, and/or a mobile phone, etc. The host memory may be non-volatile or volatile memory in the form of a cache, ROM, PROM, EPROM, EEPROM, flash memory, SRAM, DRAM, or the like.

According to some example embodiments, the host memory may drive a plurality of software or firmware. For example, the host memory may drive an operating system (OS), applications, a file system, a memory manager, and input/output drivers, etc.

Figure 2:
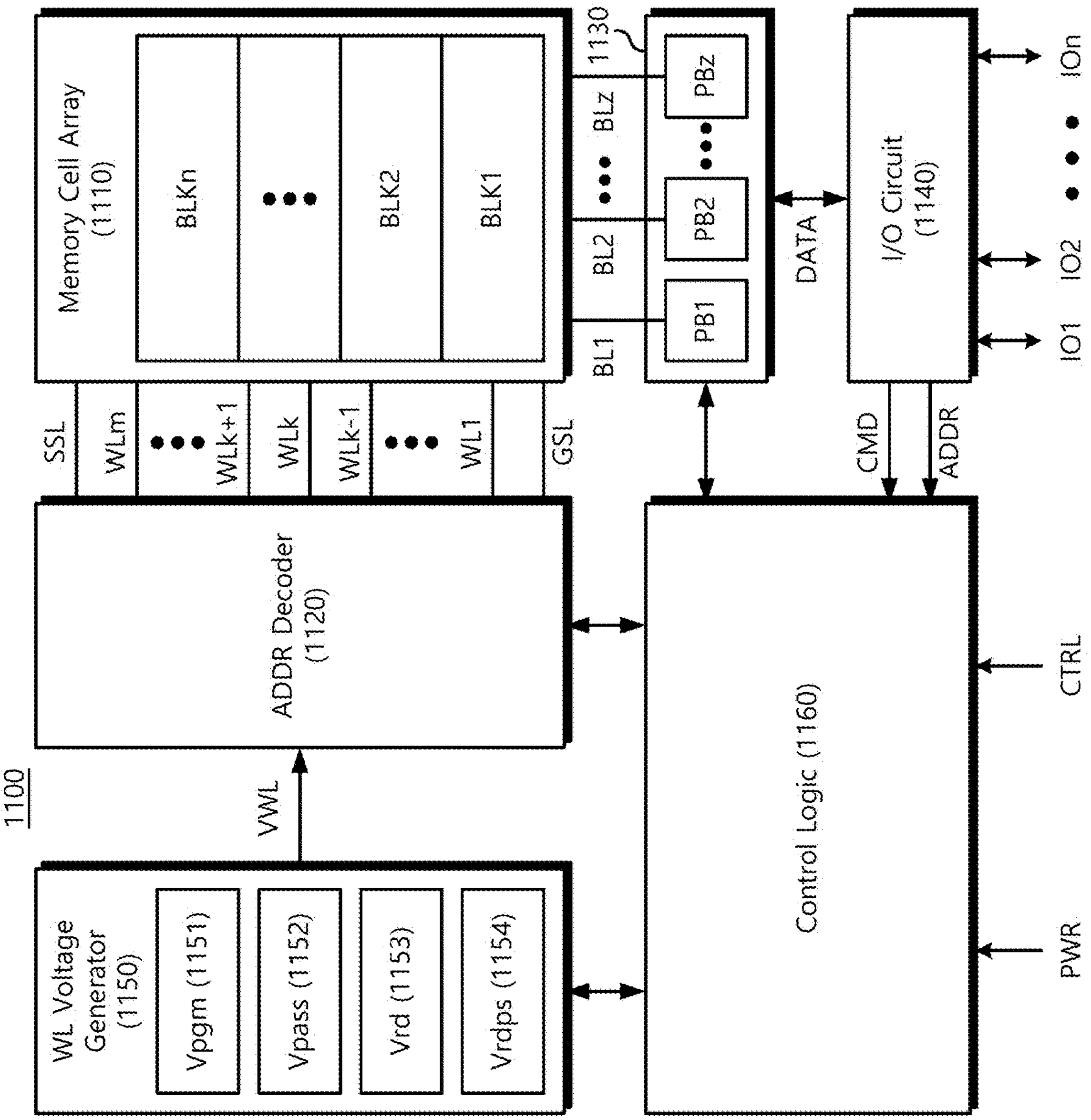
FIG. 2 is a block diagram illustrating as some example embodiments of a memory device illustrated in FIG. 1.

FIG. 2 is a block diagram illustrating as some example embodiments of a memory device illustrated in FIG. 1. The storage device 1000 of FIG. 1 may be a flash storage device based on flash memory. For example, the storage device 1000 may be implemented as an SSD, UFS and/or memory card, etc.

Referring to FIGS. 1 and 2, the memory device 1100 may include a memory cell array 1110 and a peripheral circuit. The peripheral circuit may include an address decoder 1120, a page buffer circuit 1130, an input/output circuit 1140, a word line voltage generator 1150 and/or control logic (e.g., control logic circuit) 1160.

According to some example embodiments, the memory cell array 1110 may include a plurality of memory blocks BLK1 to BLKn. Each memory block may be configured as a plurality of pages. Each page may include a plurality of memory cells. Each memory cell may store multi-bit data (for example, two or more bits). Each memory block may correspond to an erase unit, and each page may correspond to a read and/or write unit.

According to some example embodiments, the memory cell array 1110 may be formed in a direction perpendicular to a substrate. A gate electrode layer and an insulation layer may be alternately deposited on the substrate. Each memory block (for example, BLK1) may be connected to one or more string selection lines SSL, a plurality of word lines WL1 to WLm, and one or more ground selection lines GSL. WLk is a selected word line and the remaining word lines WL1 to WLk−1 and WLk+1 to WLm are unselected word lines.

According to some example embodiments, the address decoder 1120 may be connected to the memory cell array 1110 through selection lines SSL and GSL and word lines WL1 to WLm. The address decoder 1120 may select a word line during a program or read operation. The address decoder 1120 may receive the word line voltage VWL from the word line voltage generator 1150 and provide a program voltage or read voltage to the selected word line.

According to some example embodiments, the page buffer circuit 1130 may be connected to the memory cell array 1110 through bit lines BL1 to BLz. The page buffer circuit 1130 may temporarily store data DATA to be stored in the memory cell array 1110 or data DATA read from the memory cell array 1110. The page buffer circuit 1130 may include page buffers PB1 to PBz connected to respective bit lines. Each page buffer may include a plurality of latches to store or read multi-bit data.

According to some example embodiments, the input/output circuit 1140 may be internally connected to the page buffer circuit 1130 through data lines and externally connected to the memory controller (refer to FIG. 1, 1200) through the input/output lines IO1 to IOn. The input/output circuit 1140 may receive program data from the memory controller 1200 during a program operation. Also, the input/output circuit 1140 may provide data read from the memory cell array 1110 to the memory controller 1200 during a read operation.

According to some example embodiments, the word line voltage generator 1150 may receive internal power PWR from the control logic 1160 and generate a word line voltage VWL required to read or write data. The word line voltage VWL may be provided to a selected word line sWL or unselected word lines uWL through the address decoder 1120.

According to some example embodiments, the word line voltage generator 1150 may include a program voltage generator 1151 and a pass voltage generator 1152. The program voltage generator 1151 may generate a program voltage Vpgm provided to the selected word line sWL during a program operation. The pass voltage generator 1152 may generate a pass voltage Vpass provided to the selected word line sWL and the unselected word lines uWL.

According to some example embodiments, the word line voltage generator 1150 may include a read voltage generator 1153 and a read pass voltage generator 1154. The read voltage generator 1153 may generate a select read voltage Vrd provided to the select word line sWL during a read operation. The read pass voltage generator 1154 may generate a read pass voltage Vrdps provided to unselected word lines uWL. The read pass voltage Vrdps may be a voltage sufficient to turn on memory cells connected to the unselected word lines uWL during a read operation.

According to some example embodiments, the control logic 1160 may control operations such as read, write, and erase of the memory device 1100 using commands CMD, addresses ADDR and/or control signals CTRL provided from the memory controller 1200. The addresses ADDR may include a block selection address for selecting one memory block, a row address for selecting one page and/or a column address for selecting one memory cell.

Figure 3:
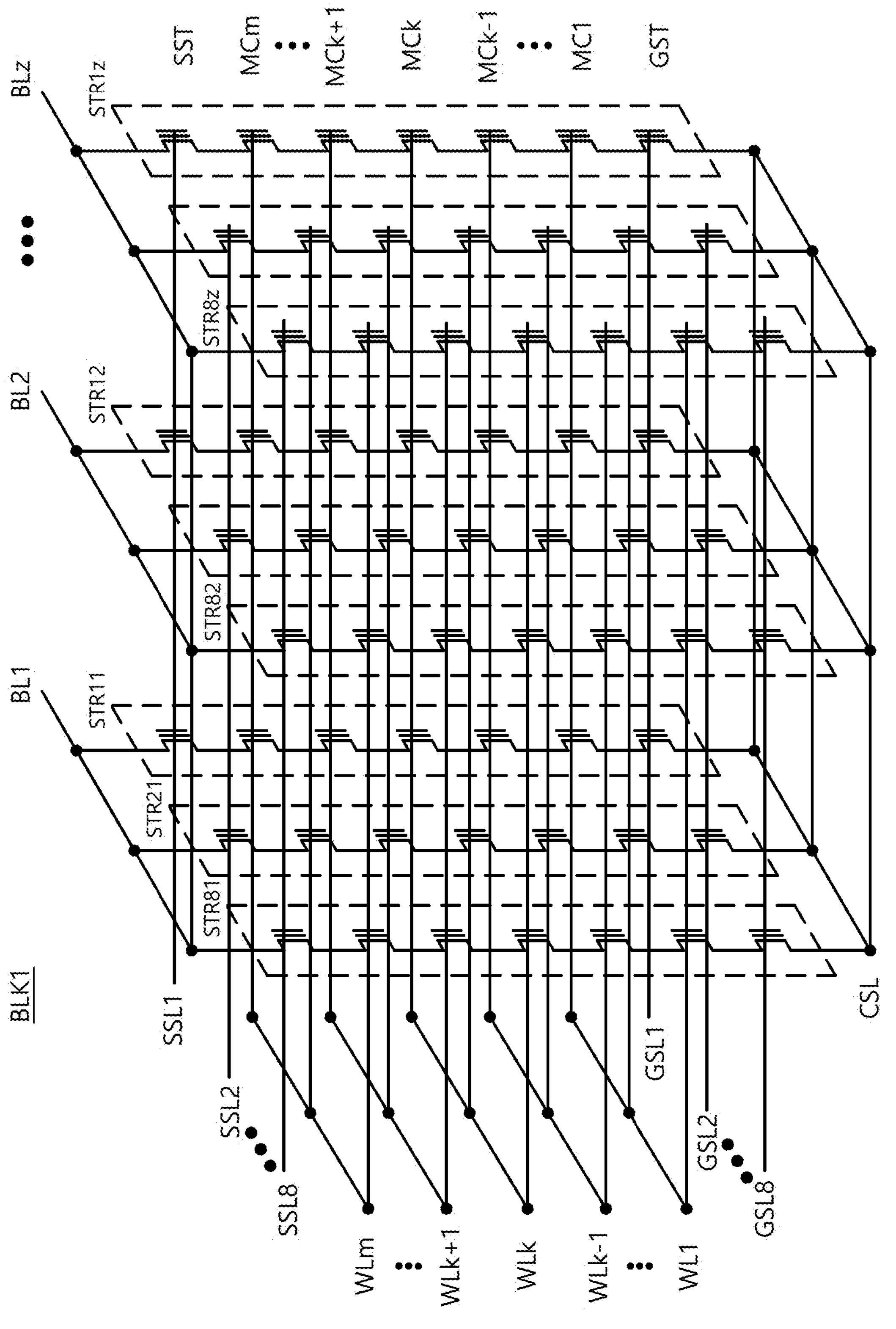
FIG. 3 is a circuit diagram illustrating some example embodiments of a memory block BLK1 of a memory cell array illustrated in FIG. 2.

FIG. 3 is a circuit diagram illustrating some example embodiments of a memory block BLK1 of a memory cell array illustrated in FIG. 2. Referring to FIG. 3, in the memory block BLK1, a plurality of cell strings STR11 to STR8z may be formed between the bit lines BL1 to BLz and a common source line CSL. Each cell string may include a string selection transistor SST, a plurality of memory cells MC1 to MCm and/or a ground selection transistor GST.

According to some example embodiments, the string selection transistors SST may be connected with string selection lines SSL1 to SSL8. The ground selection transistors GST may be connected with ground selection lines GSL1 to GSL8. The string selection transistors SST may be connected with the bit lines BL1 to BLZ, and the ground selection transistors GST may be connected with the common source line CSL.

According to some example embodiments, the first to m-th word lines WL1 to WLm may be connected with the plurality of memory cells MC1 to MCm in a row direction. The first to z-th bit lines BL1 to BLz may be connected with the plurality of memory cells MC1 to MCm in a column direction.

According to some example embodiments, the first word line WL1 may be placed above the first to eighth ground selection lines GSL1 to GSL8. The first memory cells MC1 that are placed at the same height from the substrate may be connected with the first word line WL1. The m-th word line WLm may be placed below the string selection lines SSL1 to SSL8. The m-th memory cells MCm that are placed at the same height from the substrate may be connected with the m-th word line WLm. In a similar manner, the second to m−1 memory cells MC2 to MCm−1 that are placed at the same heights from the substrate may be respectively connected with the second to m−1 word lines WL2 to WLm−1.

Figure 4:
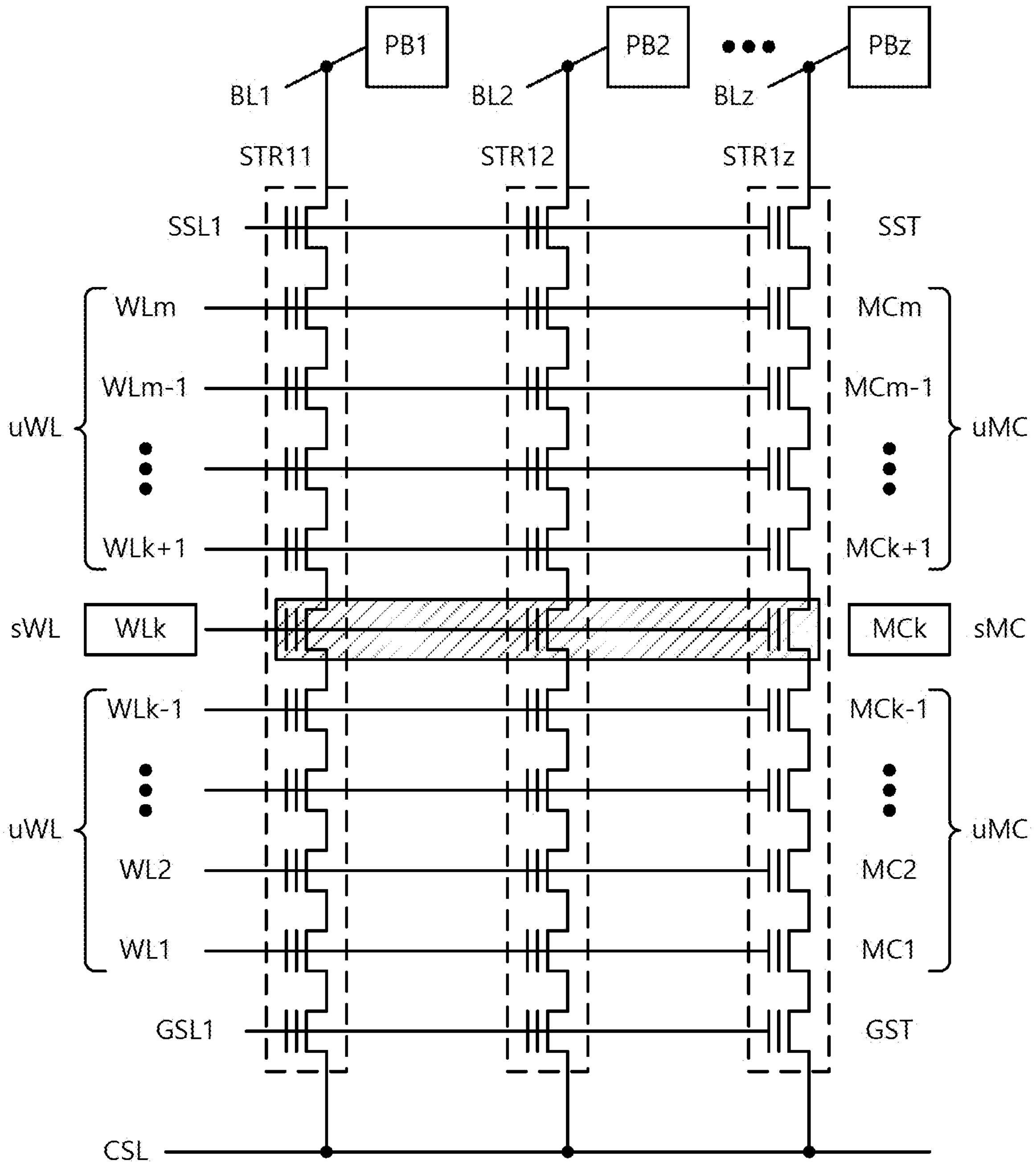
FIG. 4 is a circuit diagram illustrating cell strings selected by a first string selection line SSL1 among cell strings of a memory block BLK1 illustrated in FIG. 3.

FIG. 4 is a circuit diagram illustrating cell strings selected by a first string selection line SSL1 among cell strings of a memory block BLK1 illustrated in FIG. 3. One-one to one-z cell strings STR11 to STR1z may be selected by the first string selection line SSL1. The one-one to one-z cell strings STR11 to STR1z may be connected to first to z-th bit lines BL1 to BLz, respectively. First to z-th page buffers PB1 to PBz may be connected to the first to z-th bit lines BL1 to BLz, respectively.

According to some example embodiments, the one-one cell string STR11 may be connected to the first bit line BL1 and the common source line CSL. The one-one cell string STR11 may include string selection transistors SST selected by the first string selection line SSL1, first to m-th memory cells MC1 to MCm connected to first to m-th word lines WL1 to WLm, and ground selection transistors GST selected by first ground selection line GSL1. The one-two cell string STR12 may be connected to the second bit line BL2 and the common source line CSL. The one-z cell string STR1z may be connected to the z-th bit line BLz and the common source line CSL.

According to some example embodiments, the first word line WL1 and the m-th word line WLm may be edge word lines edge WL. The second word line WL2 and the m−1 word line WLm−1 may be edge adjacent word lines edge adjacent WL. The k-th word line WLk may be a selection word line sWL. The k−1 word line WLk−1 and the k+1 word line WLk+1 may be adjacent word lines located next to the selected word line. When the k-th word line WLk is a selected word line sWL, the remaining word lines WL1 to WLk−1 and WLk+1 to WLm may be unselected word lines uWL.

According to some example embodiments, the first memory cells MC1 and the m-th memory cells MCm may be edge memory cells. The second memory cells MC2 and the m−1 memory cells MCm−1 may be edge adjacent memory cells. The k-th memory cells MCK may be selection memory cells sMC. The k−1 memory cells MCk−1 and the k+1 memory cells MCk+1 may be memory cells adjacent to the selected memory cells (hereinafter referred to as adjacent memory cells (adjacent MC)). When the k-th memory cells MCk are selected memory cells sMC, the remaining memory cells MC1 to MCk−1 and MCk+1 to MCm may be unselected memory cells uMC.

According to some example embodiments, a set of memory cells selected by one string selection line and connected to one word line may be one page. For example, memory cells selected by the first string selection line SSL1 and connected to the k-th word line WLk may constitute one page. For example, eight pages may be configured in the k-th word line WLk. Among the eight pages, a page connected to the first string selection line SSL1 may be a selected page, and the other pages connected to the second to eighth string selection lines SSL2 to SSL8 may be unselected pages.

Figure 5:
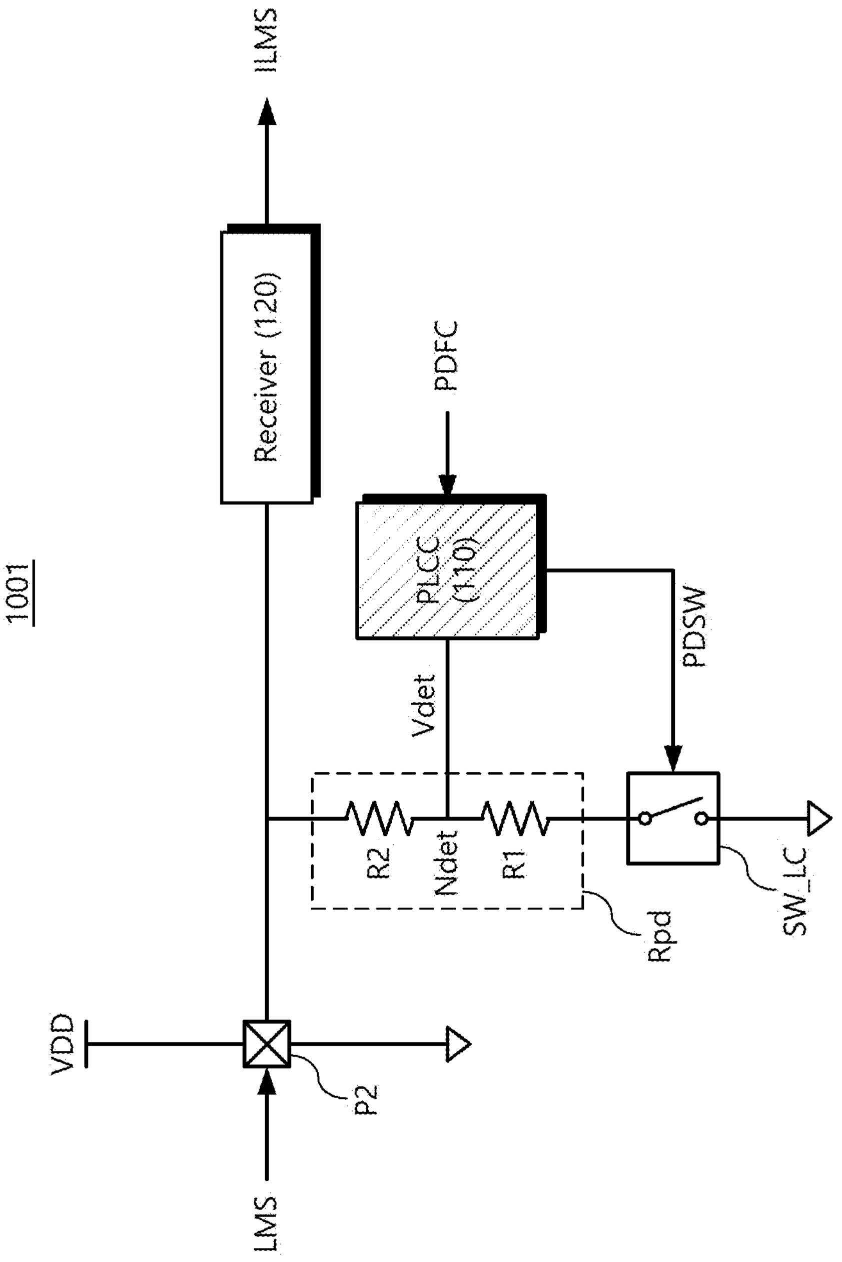
FIG. 5 is a diagram illustrating some example embodiments of a pad level control circuit of FIG. 1.

FIG. 5 is a diagram illustrating some example embodiments of a pad level control circuit of FIG. 1. Referring to FIGS. 1 and 5, a device interconnect layer 1001 may include a second pad P2 receiving a link startup mode signal LMS.

According to some example embodiments, the device interconnect layer 1001 may include a receiver 120 connected to the second pad P2. The receiver 120 may convert the link startup mode signal LMS into an internal link startup mode signal ILMS. The memory controller 1200 of FIG. 1 may determine an operation mode (for example, a first link startup mode or a second link startup mode) of the storage device 1000 based on the internal link startup mode signal ILMS. As an example, when being in a default state or receiving the link startup mode signal LMS of a low-level, the storage device 1000 may operate in the first link startup mode (for example, a low-speed link startup mode). When receiving the link startup mode signal LMS of a high level, the storage device 1000 may operate in the second link startup mode (for example, a high-speed link startup mode).

When no signal is applied to the second pad P2 or when the second pad P2 is floating, a voltage level of the second pad P2 may be unstable. As an example, if the host 1500 does not support multiple link startup modes, the host interconnect layer 1501 may not be connected to the second pad P2. When the voltage level of the second pad P2 is unstable, the receiver 120 may also malfunction.

Accordingly, when no signal is applied to the second pad P2 or when the second pad P2 is floating, a pull-down resistor Rpd may fix the voltage level of the second pad P2 to a specified level (for example, a ground voltage). However, when the link startup mode signal LMS is applied to the second pad P2 while the pull-down resistor Rpd fixes the voltage level of the second pad P2 at the specified level, a current leakage may occur through the pull-down resistor Rpd.

According to some example embodiments, the device interconnect layer 1001 may include a level control switch SW_LC and a pad level control circuit 110 connected between a pull-down resistor Rpd and a ground terminal. For example, the level control switch SW_LC may be turned on or off based on a pull-down switching signal PDSW output from the pad level control circuit 110.

According to some example embodiments, the pull-down resistor Rpd may be connected to or disconnected from a ground terminal depending on whether the level control switch SW_LC is turned on or off. Accordingly, when receiving the link startup mode signal LMS, the current leakage through the pull-down resistor Rpd may be limited and/or prevented.

According to some example embodiments, the pad level control circuit 110 may operate in an automatic mode. For example, the pad level control circuit 110 may automatically operate based on the link startup mode signal LMS. The pull-down resistor Rpd may include a first resistor R1 and a second resistor R2. The first resistor R1 may be connected between a detection node Ndet and the level control switch SW_LC. The second resistor R2 may be connected between the second pad P2 and the detection node Ndet.

According to some example embodiments, a detection voltage Vdet of the detection node Ndet may be determined according to a ratio of the first resistance R1 and the second resistance R2. The pad level control circuit 110 may generate a pull-down switching signal PDSW based on the detection voltage Vdet. As an example, when the detection voltage Vdet is higher than a reference voltage, the pad level control circuit 110 may output a pull-down switching signal PDSW (for example, low level) which turns off the level control switch SW_LC. When the detection voltage Vdet is less than the reference voltage, the pad level control circuit 110 may output a pull-down switching signal PDSW (for example, high level) which turns on the level control switch SW_LC.

According to some example embodiments, the pad level control circuit 110 may operate in a manual mode. For example, the pad level control circuit 110 may operate in the automatic mode or the manual mode based on a pull-down forcing signal PDFC. For example, when receiving the pull-down forcing signal PDFC of a low-level, the pad level control circuit 110 may operate in the automatic mode. When receiving the pull-down forcing signal PDFC of a high level, the pad level control circuit 110 may operate in the manual mode.

According to some example embodiments, in the manual mode, the pad level control circuit 110 may output a pull-down switching signal PDSW (for example, high level) which turns on the level control switch SW_LC regardless of the link startup mode signal LMS. If necessary, the pad level control circuit 110 may connect the pull-down resistor Rpd to the ground terminal while the link startup mode signal LMS is received into the second pad.

FIG. 6 is a table illustrating levels of signals related to a pad level control circuit of FIG. 5 for each mode. Referring to FIGS. 5 and 6, the pad level control circuit 110 may operate in an automatic mode or a manual mode based on a pull-down forcing signal PDFC.

According to some example embodiments, when the pull-down forcing signal PDFC is at a low level, the pad level control circuit 110 may operate in the automatic mode. In the automatic mode, the level control switch SW_LC may basically be turned on, and the pull-down resistor Rpd may be connected to the ground terminal. When the link startup mode signal LMS is at a low level or the link startup mode signal LMS is not input, the detection voltage Vdet may be also at a low level. When the detection voltage Vdet is at a low level, the pad level control circuit 110 may output the pull-down switching signal PDSW of a high level. Since the pull-down switching signal PDSW is at a high level, the level control switch SW_LC may remain to be turned on, and the pull-down resistor Rpd may be connected to the ground terminal. The storage device 1000 may thus operate in a first link startup mode LSM1 (for example, low-speed link startup mode).

According to some example embodiments, in the automatic mode, when the link startup mode signal LMS of a high level is input, the detection voltage Vdet may be changed to a high level higher than a reference voltage through voltage distribution of the pull-down resistor Rpd. When the detection voltage Vdet is at a high level, the pad level control circuit 110 may output the pull-down switching signal PDSW of a low level. Since the pull-down switching signal PDSW is at a low level, the level control switch SW_LC may be changed to be turned off, and the pull-down resistor Rpd may be disconnected from the ground terminal. The storage device 1000 may thus operate in a second link startup mode LSM2 (for example, high-speed link startup mode). The pull-down resistor Rpd may be separated from the ground terminal, so a current leakage due to the pull-down resistor Rpd may be limited and/or prevented.

According to some example embodiments, when the pull-down forcing signal PDFC is at a high level, the pad level control circuit 110 may operate in the manual mode. In the manual mode, the pad level control circuit 110 may output the pull-down switching signal PDSW of a high level regardless of the link startup mode signal LMS. Since the pull-down switching signal PDSW is at a high level, the level control switch SW_LC may remain to be turned on, and the pull-down resistor Rpd may be connected to the ground terminal.

Figure 7:
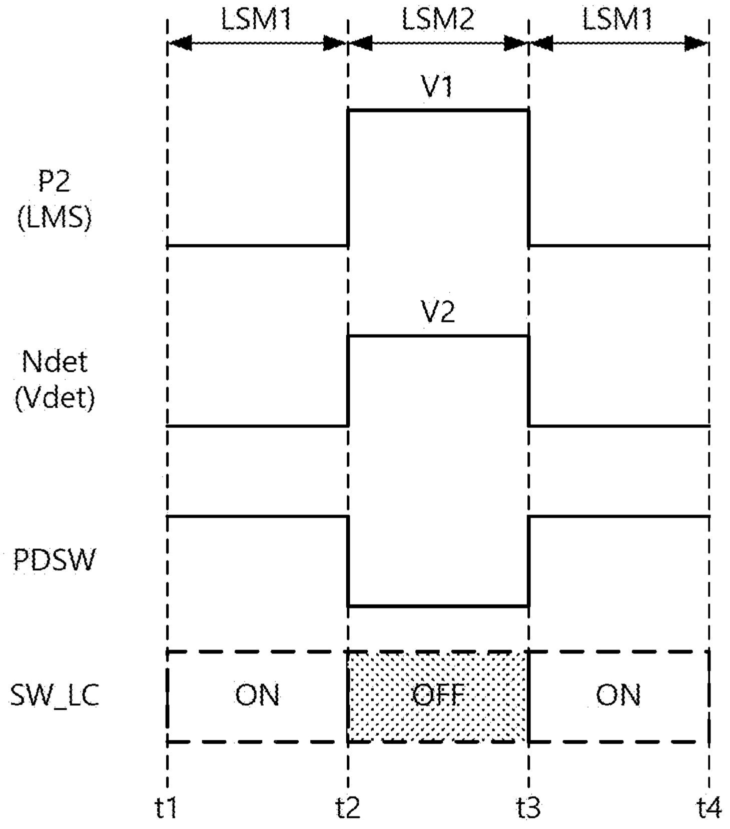
FIG. 7 is a timing diagram illustrating some example embodiments of an operation of a pad level control circuit of FIG. 5 in an automatic mode.

FIG. 7 is a timing diagram illustrating some example embodiments of an operation of a pad level control circuit of FIG. 5 in an automatic mode. Referring to FIGS. 5 to 7, in the automatic mode, the pull-down forcing signal PDFC may be maintained at a low level.

According to some example embodiments, between a first time point t1 and a second time point t2, the link startup mode signal LMS may be at a low level or the link startup mode signal LMS may not be input. When the link startup mode signal LMS is at a low level or the link startup mode signal LMS is not input, the detection voltage Vdet may be also at a low level. When the detection voltage Vdet is at a low level, the pad level control circuit 110 may output the pull-down switching signal PDSW of a high level. Since the pull-down switching signal PDSW is at a high level, the level control switch SW_LC may remain to be turned on, and the pull-down resistor Rpd may be connected to the ground terminal. The storage device 1000 may thus operate in the first link startup mode LSM1 (for example, the low-speed link startup mode).

According to some example embodiments, the link startup mode signal LMS of a high level may be input between the second time point t2 and a third time point t3. When the link startup mode signal LMS of a high level is input, the detection voltage Vdet may be changed to a high level higher than the reference voltage through voltage distribution of the pull-down resistor Rpd. When the detection voltage Vdet is at a high level, the pad level control circuit 110 may output the pull-down switching signal PDSW of a low level. Since the pull-down switching signal PDSW is at a low level, the level control switch SW_LC may be changed to be turned off, and the pull-down resistor Rpd may be disconnected from the ground terminal. The storage device 1000 may thus operate in the second link startup mode LSM2 (for example, the high-speed link startup mode). The pull-down resistor Rpd may be separated from the ground terminal, so a current leakage due to the pull-down resistor Rpd may be limited and/or prevented.

According to some example embodiments, between the third time t3 and a fourth time t4, the link startup mode signal LMS may change to a low level again. When the link startup mode signal LMS changes to a low level, the detection voltage Vdet may change to a low level. When the detection voltage Vdet is at a low level, the pad level control circuit 110 may output the pull-down switching signal PDSW of a high level. Since the pull-down switching signal PDSW is at a high level, the level control switch SW_LC may be changed to be turned on, and the pull-down resistor Rpd may be reconnected to the ground terminal. The storage device 1000 may thus operate again in the first link startup mode LSM1 (for example, the low-speed link startup mode).

Figure 8:
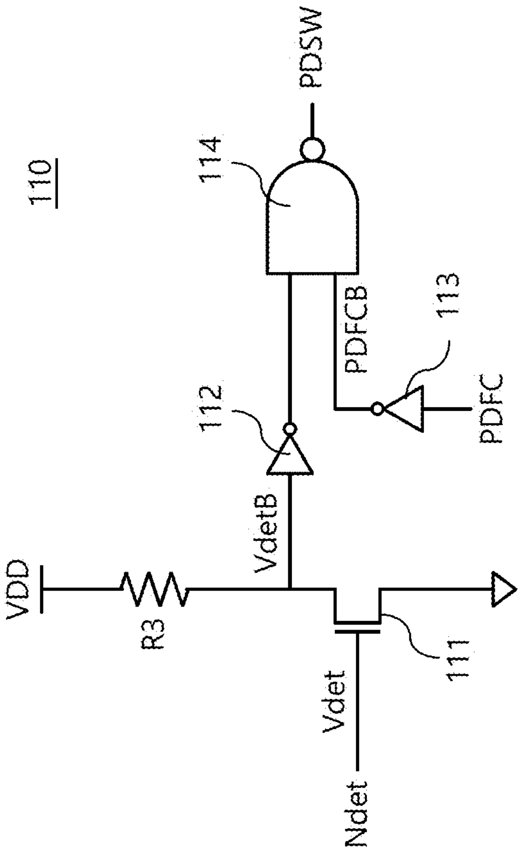
FIG. 8 is a circuit diagram illustrating some example embodiments of a pad level control circuit of FIG. 5.

FIG. 8 is a circuit diagram illustrating some example embodiments of a pad level control circuit 110 of FIG. 5. Referring to FIGS. 5 to 8, the pad level control circuit 110 may include an N-type transistor 111, a first inverter 112, a second inverter 113, a NAND operation circuit 114 and/or a third resistor R3.

According to some example embodiments, a gate of the N-type transistor 111 may be connected to the detection node Ndet. A drain of the N-type transistor 111 may be connected to the third resistor R3. A source of the N-type transistor 111 may be connected to the ground terminal. The third resistor R3 may be connected between a power supply voltage VDD and the drain of the N-type transistor 111.

According to some example embodiments, a complementary detection signal VdetB output from the drain of the N-type transistor 111 may be inverted by the first inverter 112 and input to the NAND operation circuit 114. The pull-down forcing signal PDFC may be inverted by the second inverter 113 and input to the NAND operation circuit 114. The NAND operation circuit 114 may perform a NAND operation on an inverted signal (e.g., an inverted version) of the complementary detection signal VdetB and an inverted signal (e.g., an inverted version) of the pull-down forcing signal PDFC (for example, a complementary pull-down forcing signal PDFCB) to output the pull-down switching signal PDSW. As an example, the pull-down switching signal PDSW generated based on the detection signal Vdet and the pull-down forcing signal PDFC may be output as illustrated in the truth table of FIG. 6.

Figure 9:
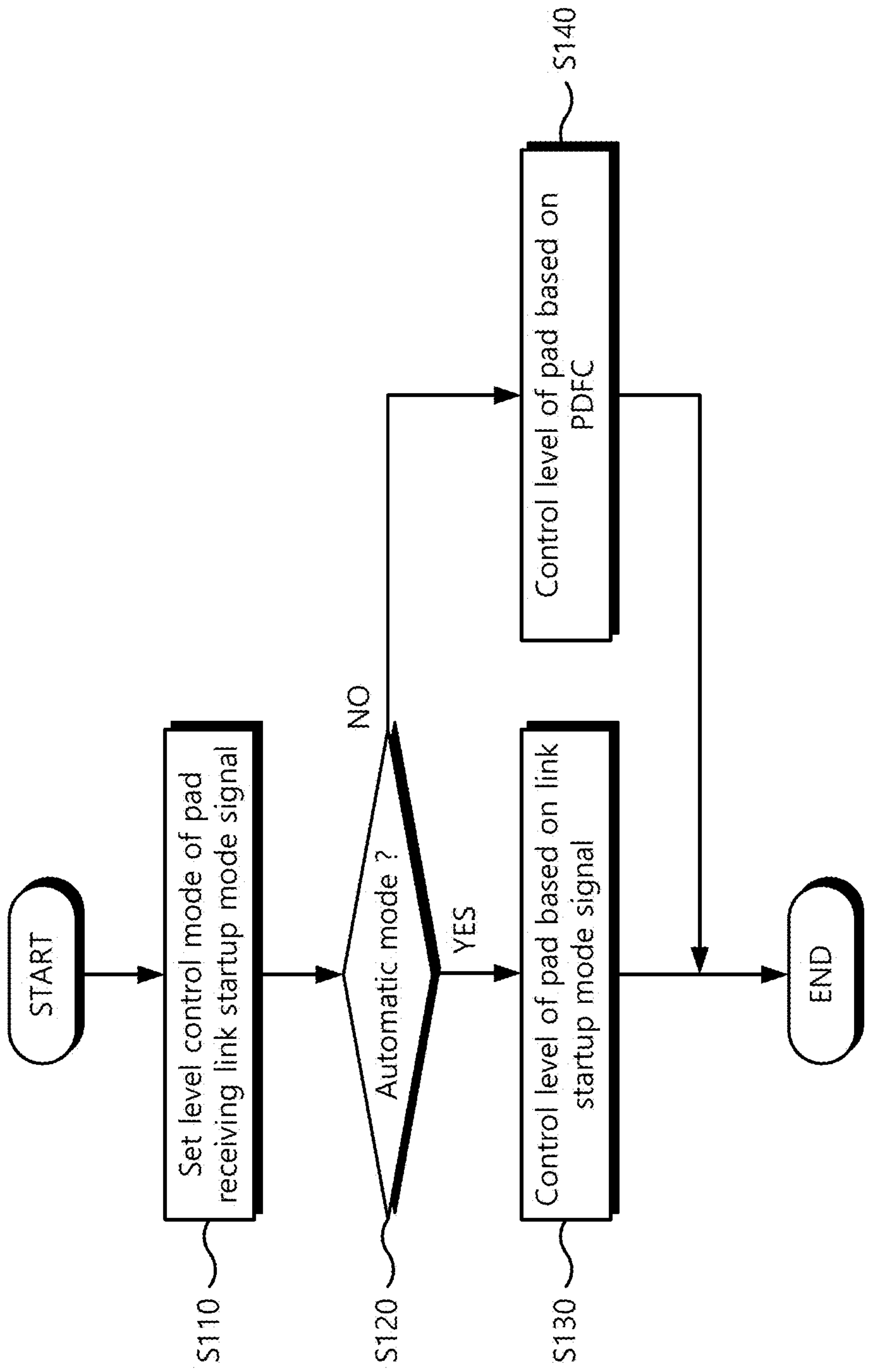
FIG. 9 is a flowchart illustrating a method of controlling a level of a second pad in a storage device of FIG. 1.

FIG. 9 is a flowchart illustrating a method of controlling a level of a second pad P2 in a storage device of FIG. 1. Referring to FIGS. 1 to 9, the storage device 1000 may automatically or manually control the voltage level of the second pad P2 on which the link startup mode signal LMS is received.

According to some example embodiments, in operation S110, the storage device 1000 may set a level control mode of the second pad P2 receiving the link startup mode signal LMS. For example, the level control mode of the second pad P2 may include an automatic mode or a manual mode.

According to some example embodiments, in operation S120, when the level control mode of the second pad P2 is the automatic mode (e.g., YES at S120), the storage device 1000 may perform operation S130. When the level control mode of the second pad P2 is not the automatic mode (or is the manual mode) (e.g., NO at S120), the storage device 1000 may perform operation S140. For example, the memory controller 1200 may generate the pull-down forcing signal PDFC. When the pull-down forcing signal PDFC is at a low level, the pad level control circuit 110 may operate in the automatic mode. When the pull-down forcing signal PDFC is at a high level, the pad level control circuit 110 may operate in the manual mode.

According to some example embodiments, in operation S130, the storage device 1000 may perform a level control operation of the second pad P2 based on the link startup mode signal LMS in the automatic mode. For example, in the automatic mode, the level control switch SW_LC may basically be in an on state, and the pull-down resistor Rpd may be connected to the ground terminal.

For example, in the automatic mode, when the link startup mode signal LMS is at a low level or when the link startup mode signal LMS is not input, the detection voltage Vdet may be at a low level. When the detection voltage Vdet is at a low level, the pad level control circuit 110 may output the pull-down switching signal PDSW of a high level. Since the pull-down switching signal PDSW is at a high level, the level control switch SW_LC may remain to be turned on, and the pull-down resistor Rpd may be connected to the ground terminal. The storage device 1000 may thus operate in a first link startup mode LSM1 (for example, a low-speed link startup mode).

As an example, in the automatic mode, when the link startup mode signal LMS of a high level is input, the detection voltage Vdet may be changed to a high level higher than a reference voltage through voltage distribution of the pull-down resistor Rpd. When the detection voltage Vdet is at a high level, the pad level control circuit 110 may output the pull-down switching signal PDSW of a low level. Since the pull-down switching signal PDSW is at a low level, the level control switch SW_LC may be changed to be turned off, and the pull-down resistor Rpd may be disconnected from the ground terminal. The storage device 1000 may thus operate in a second link startup mode LSM2 (for example, a high-speed link startup mode). The pull-down resistor Rpd may be separated (e.g., disconnected) from the ground terminal, so a current leakage due to the pull-down resistor Rpd may be limited and/or prevented.

According to some example embodiments, in operation S140, the storage device 1000 may perform the level control operation of the second pad P2 based on the pull-down forcing signal PDFC in the manual mode. For example, in the manual mode, the pull-down forcing signal PDFC may be at a high level, and the pad level control circuit 110 may output the pull-down switching signal PDSW of a high level regardless of the link startup mode signal LMS. Since the pull-down switching signal PDSW is at a high level, the level control switch SW_LC may remain to be turned on, and the pull-down resistor Rpd may be connected to the ground terminal.

Figure 10:
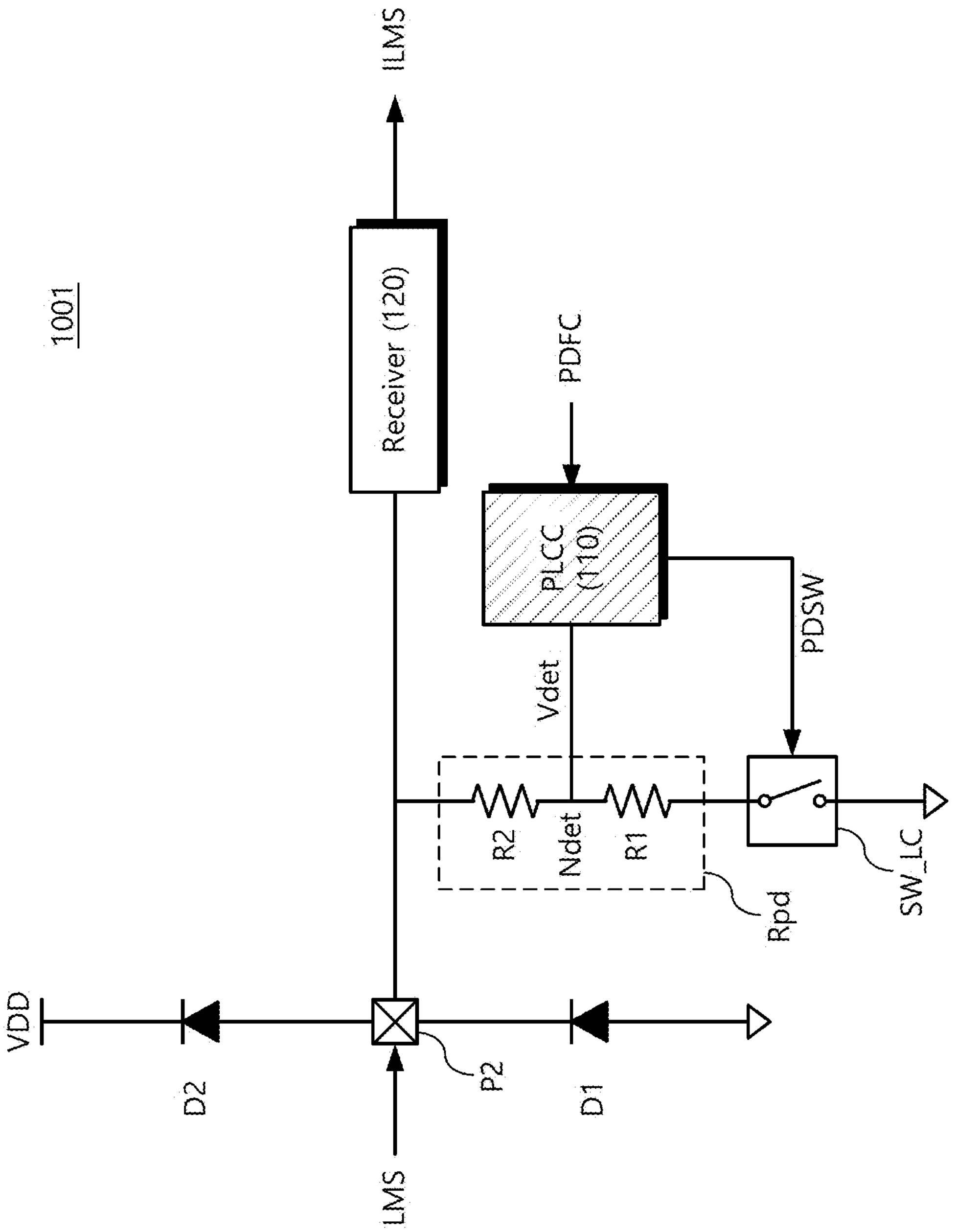
FIG. 10 is a diagram illustrating some example embodiments of a pad level control circuit of FIG. 1.

FIG. 10 is a diagram illustrating another example embodiment of a pad level control circuit of FIG. 1. Referring to FIGS. 1, 5 and 10, the device interconnect layer 1001 may perform a level control operation of the second pad P2 based on a link startup mode signal LMS. The device interconnect layer 1001 may include the same or similar configuration and characteristics as the device interconnect layer 1001 of FIG. 5. Description that is the same or similar to the configuration and characteristics of the device interconnect layer 1001 of FIG. 5 will be omitted.

According to some example embodiments, the device interconnect layer 1001 may include a first diode D1 and a second diode D2 connected to the second pad P2. For example, the first diode D1 and the second diode D2 may protect components included in the device interconnect layer 1001. A link startup mode signal LMS which exceeds a performance of the pad level control circuit 110 or the receiver 120 may be input through the second pad P2. The first diode D1 and the second diode D2 may limit a size of the link startup mode signal LMS to protect components included in the device interconnect layer 1001 from an electrical shock.

Figure 11:
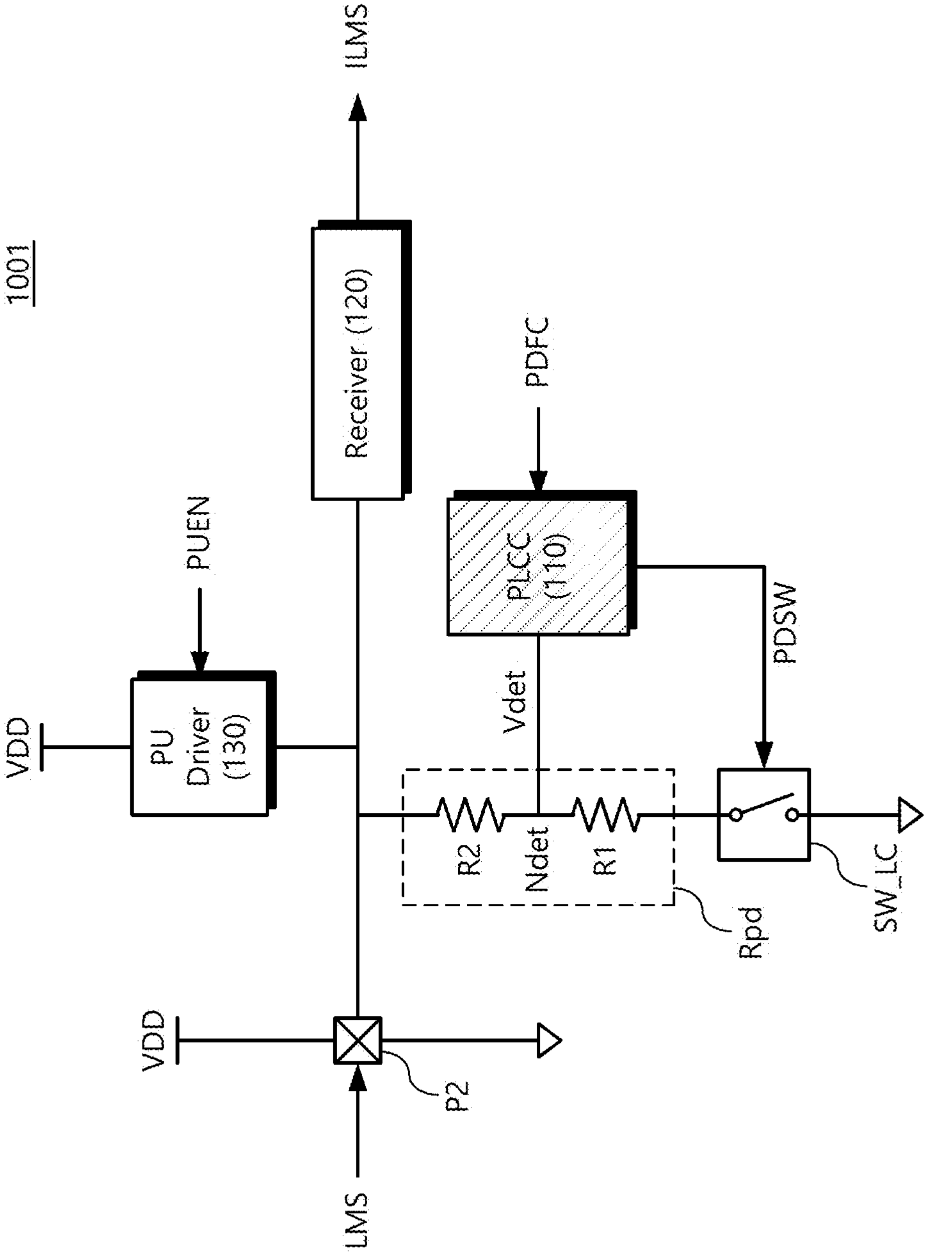
FIG. 11 is a diagram illustrating some example embodiments of a pad level control circuit of FIG. 1.

FIG. 11 is a diagram illustrating another example embodiment of a pad level control circuit of FIG. 1. Referring to FIGS. 1, 5 and 11, the device interconnect layer 1001 may perform a level control operation of the second pad P2 based on a link startup mode signal LMS. The device interconnect layer 1001 may include the same or similar configuration and characteristics as the device interconnect layer 1001 of FIG. 5. Description that is the same or similar to the configuration and characteristics of the device interconnect layer 1001 of FIG. 5 will be omitted.

According to some example embodiments, the device interconnect layer 1001 may include a pull-up driver 130 connected to the second pad P2. For example, the pull-up driver 130 may operate based on a pull-up enable signal PUEN.

According to some example embodiments, the pull-up driver 130 may operate complementary to the pull-down resistor Rpd. For example, when the link startup mode signal LMS of a high level is input and the level control switch SW_LC is turned off, the memory controller 1200 may generate the pull-up enable signal PUEN. Through the pull-up enable signal PUEN, the pull-up driver 130 may be activated. When the pull-up driver 130 is activated, the link startup mode signal LMS may be transmitted to the receiver 120 without attenuation.

Figure 12:
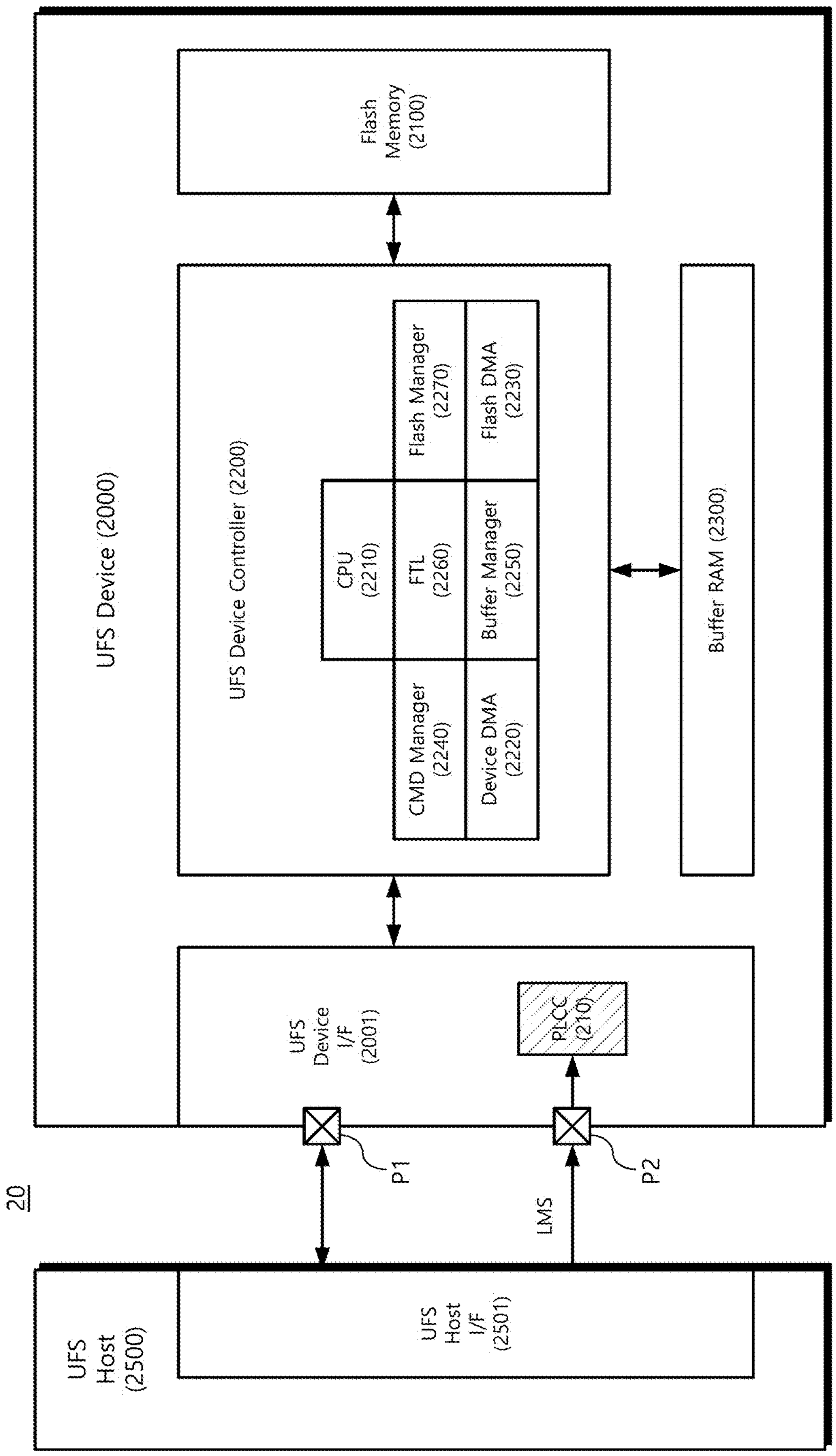
FIG. 12 is a block diagram illustrating a universal flash storage (UFS) system according to some example embodiments.

FIG. 12 is a block diagram illustrating a universal flash storage (UFS) system according to some example embodiments. Referring to FIG. 12, a UFS system 20 may include a UFS host 2500 and a UFS device 2000.

According to some example embodiments, the UFS host 2500 may include an application, a device driver, a host controller and/or a buffer RAM. The host controller may include a command queue, a host DMA, a power manager, etc.

According to some example embodiments, commands (for example, write commands) generated by the application and/or the device driver of the UFS host 2500 may be input into the command queue of the host controller. The command queue may store commands to be provided to the UFS device 2000 in order. Commands stored in the command queue may be provided to the host DMA. The host DMA may send commands to the UFS device 2000 through a UFS host interface 2501.

According to some example embodiments, the UFS device 2000 may include a flash memory 2100, a UFS device controller 2200 and/or a buffer RAM 2300. The UFS device controller 2200 may include a central processing unit (CPU) 2210, a device DMA 2220, a flash DMA 2230, a command manager 2240, a buffer manager 2250, a flash translation layer (FTL) 2260 and/or a flash manager 2270.

According to some example embodiments, commands provided from the UFS host 2500 to the UFS device 2000 may be provided to the device DMA 2220 through a UFS device interface 2001. The device DMA 2220 may provide input commands to the command manager 2240. The command manager 2240 may allocate the buffer RAM 2300 to receive data through the buffer manager 2250.

The command manager 2240 may calculate (e.g., determine) a time required to store the corresponding data in the flash memory 2100 through the FTL 2260 and use the time to predict an idle time of the interface. For example, the command manager 2240 may calculate a standby time of the interface based on operation times such as programming, reading and/or erasing of the flash memory 2100. The standby time of the interface may be calculated to be the same as the operation time of the flash memory 2100, or may be calculated by deducting a time to receive next data in advance for continuing operations of the flash memory 2100.

According to some example embodiments, the UFS device 2000 may store data provided from the UFS host 2500 in the buffer RAM 2300 through the device DMA 2220 and buffer manager 2250. Data stored in the buffer RAM 2300 may be provided to the flash manager 2270 through the flash DMA 2230. The flash manager 2270 may refer to an address mapping information of the FTL 2260 and store data at a selected address of the flash memory 2100.

According to some example embodiments, when data transmission and a program operation required for the command are completed, the UFS device 2000 may send a response signal to the UFS host 2500 through the interface and notify the completion of the command. The UFS host 2500 may notify the device driver and the application whether the command for which the response signal was received has been completed, and may terminate operations for the command.

According to some example embodiments, the UFS device interface 2001 may include at least one first pad P1. For example, the UFS device interface 2001 may exchange various signals (for example, data, commands, addresses, etc.) with the UFS host interface 2501 through the first pad P1.

According to some example embodiments, the UFS device interface 2001 may include a second pad P2. For example, the UFS device interface 2001 may receive a link startup mode signal LMS through the second pad P2. The UFS device interface 2001 may determine a link startup mode of the UFS device 2000 based on the link startup mode signal LMS. As an example, the UFS device 2000 may operate in a low-speed link startup mode or a high-speed link startup mode.

According to some example embodiments, the UFS device interface 2001 may include a pad level control circuit 210. For example, the pad level control circuit 210 may be connected to the second pad P2. The UFS device interface 2001 may receive the link startup mode signal LMS from the UFS host interface 2501 through the second pad P2. The pad level control circuit 210 may control a voltage level of the second pad P2 based on the link startup mode signal LMS. As an example, the second pad P2 may basically be set to a first level mode (for example, a pull-down mode). The pad level control circuit 210 may maintain the second pad P2 in the first level mode or change the second pad P2 to a second level mode (for example, a pull-up mode) based on the link startup mode signal LMS. For example, the UFS device controller 2200 may generate a pull-down forcing signal that indicates a level control mode of the pad level control circuit 210. For example, similarly as described previously, the pad level control circuit 210 may operate in an automatic mode when receiving the pull-down forcing signal of a low level and may operate in a manual mode when receiving the pull-down forcing signal of a high level.

According to some example embodiments, the pad level control circuit 210 may have the same or similar configuration, functionality and characteristics as the pad level control circuit 110 of FIG. 1, 5, 10 or 11. Descriptions of the same or similar configuration and characteristics as those of the pad level control circuit 110 of FIG. 1, 5, 10 or 11 will be omitted.

According to the present disclosure, by using the pad level control circuit and the level control switch, it may be possible to limit and/or prevent current leakage caused by a pull-down resistor connected to a link startup mode decision pad (e.g., the second pad P2 in FIGS. 1, 5 and 10-12) when receiving a link startup mode signal, thus reducing current consumption and prolonging battery lifetime in battery powered devices for example.

One or more of the elements disclosed above may include or be implemented in processing circuitry such as hardware including logic circuits; a hardware/software combination such as a processor executing software; or a combination thereof. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, an application-specific integrated circuit (ASIC), etc.

While the present disclosure has been described with reference to some example embodiments thereof, it will be apparent to those of ordinary skill in the art that various changes and modifications may be made thereto without departing from the spirit and scope of the present disclosure as set forth in the following claims.

What is claimed is:

1. A storage device comprising:
- a non-volatile memory device;
- a memory controller configured to control input of first data to the non-volatile memory device and output of second data from the non-volatile memory device; and
- a device interconnect layer configured to transmit signals received from a host to the memory controller,
- wherein the device interconnect layer comprises
  - a first pad configured to input the first data to be stored in the non-volatile memory device and to output the second data from the non-volatile memory device,
  - a second pad configured to receive a link startup mode signal from the host, the link startup mode signal being configured to cause the storage device to operate in a link startup mode,
  - a pull-down resistor between the second pad and a ground terminal, and
  - a pad level control circuit configured to control a voltage level of the second pad by controlling connection or disconnection of the pull-down resistor to the ground terminal based on the link startup mode signal.

2. The storage device of claim 1, wherein the device interconnect layer further comprises a level control switch connected between the pull-down resistor and the ground terminal,
- wherein the pull-down resistor comprises
  - a first resistor connected between the level control switch and a detection node, and
  - a second resistor connected between the detection node and the second pad,
- wherein the pad level control circuit is configured to output a pull-down switching signal that turns the level control switch on or off based on a voltage level of the detection node.

3. The storage device of claim 2, wherein the pull-down resistor is configured to provide the voltage level of the detection node based on a voltage distribution of a voltage level of the link startup mode signal by the first resistor and the second resistor.

4. The storage device of claim 2, wherein the pad level control circuit is configured to output the pull-down switching signal to turn on the level control switch when the voltage level of the detection node is less than a reference voltage.

5. The storage device of claim 2, wherein the pad level control circuit is configured to output the pull-down switching signal to turn off the level control switch when the voltage level of the detection node is equal to or higher than a reference voltage.

6. The storage device of claim 2, wherein the pad level control circuit comprises:
- a third resistor including a first end connected to a power supply voltage node;
- an N-type transistor including a gate connected to the detection node, a drain connected to a second end of the third resistor, and a source connected to the ground terminal; and
- a NAND circuit configured to perform a NAND operation on an inverted version of a drain voltage of the N-type transistor and an inverted version of a pull-down forcing signal to output the pull-down switching signal.

7. The storage device of claim 1, wherein the memory controller is configured to generate a pull-down forcing signal that indicates a level control mode of the pad level control circuit, and
- wherein the pad level control circuit is configured to operate in an automatic mode when the pull-down forcing signal is a low level and to operate in a manual mode when the pull-down forcing signal is a high level.

8. The storage device of claim 7, wherein in the automatic mode the pad level control circuit is configured to control the connection or disconnection of the pull-down resistor to the ground terminal according to a level of the link startup mode signal.

9. The storage device of claim 8, wherein in the automatic mode the pad level control circuit is configured to connect the pull-down resistor to the ground terminal when the link startup mode signal is a low level or no signal is received through the second pad.

10. The storage device of claim 8, wherein in the automatic mode the pad level control circuit is configured to disconnect the pull-down resistor from the ground terminal when the link startup mode signal is a high level.

11. The storage device of claim 7, wherein in the manual mode the pad level control circuit is configured to connect the pull-down resistor to the ground terminal regardless of a level of the link startup mode signal.

12. A universal flash storage (UFS) device comprising:
- a flash memory;
- a UFS device controller configured to control input of first data to the flash memory and output of second data from the flash memory; and
- a UFS device interface configured to transmit signals received from a UFS host to the UFS device controller,
- wherein the UFS device interface comprises
  - a first pad configured to input the first data to be stored in the flash memory and to output the second data from the flash memory,
  - a second pad configured to receive a link startup mode signal from the UFS host, the link startup mode signal being configured to cause the UFS device to operate in a link startup mode,
  - a pull-down resistor configured to determine a voltage level of the second pad, and
  - a pad level control circuit configured to control the voltage level of the second pad by controlling connection or disconnection of the pull-down resistor to a ground terminal based on the link startup mode signal.

13. The UFS device of claim 12, wherein the UFS device controller is configured to generate a pull-down forcing signal that indicates a level control mode of the pad level control circuit, and wherein the pad level control circuit is configured to operate in an automatic mode when the pull-down forcing signal is a low level and to operate in a manual mode when the pull-down forcing signal is a high level.

14. The UFS device of claim 13, wherein in the automatic mode the pad level control circuit is configured to connect the pull-down resistor to the ground terminal when the link startup mode signal is a low level or no signal is received through the second pad.

15. The UFS device of claim 13, wherein in the automatic mode the pad level control circuit is configured to disconnect the pull-down resistor from the ground terminal when the link startup mode signal is a high level.

16. The UFS device of claim 13, wherein in the manual mode the pad level control circuit is configured to connect the pull-down resistor to the ground terminal regardless of a level of the link startup mode signal.

17. A level control method of a link startup mode decision pad in a storage device, the method comprising:

setting a level control mode of the link startup mode decision pad; and connecting or disconnecting a pull-down resistor to a ground terminal based on a voltage level of a link startup mode signal received through the link startup mode decision pad when the level control mode is set to an automatic mode, the pull-down resistor being connected to the link startup mode decision pad.

18. The method of claim 17, further comprising:

connecting the pull-down resistor to the ground terminal regardless of the link startup mode signal when the level control mode is set to a manual mode.

19. The method of claim 17, wherein the connecting or disconnecting of the pull-down resistor to the ground terminal includes connecting the pull-down resistor to the ground terminal when the link startup mode signal is a low level or when the link startup mode signal is not received.

20. The method of claim 17, wherein the connecting or disconnecting of the pull-down resistor to the ground terminal includes disconnecting the pull-down resistor from the ground terminal when the link startup mode signal is a high level.

* * * * *